United States Patent

Rodder

[19]

[11] Patent Number: 4,999,690
[45] Date of Patent: Mar. 12, 1991

[54] TRANSISTOR

[75] Inventor: Mark S. Rodder, Dallas, Tex.

[73] Assignee: Texas Instruments Incorporated, Dallas, Tex.

[21] Appl. No.: 452,855

[22] Filed: Dec. 19, 1989

[51] Int. Cl.⁵ .................. H01L 27/01; H01L 45/00; H01L 27/12

[52] U.S. Cl. .......................... 357/23.7; 357/2; 357/4

[58] Field of Search ............... 357/23.7, 4, 2

[56] References Cited

U.S. PATENT DOCUMENTS 4,554,572 11/1985 Chatterjee ............... 357/23.7

FOREIGN PATENT DOCUMENTS 58-169977 6/1983 Japan .
0019770 1/1989 Japan ............... 357/23.7

Primary Examiner—Rolf Hille
Assistant Examiner—Wael Fahmy
Attorney, Agent, or Firm—James C. Kesterson; James T. Comfort; Melvin Sharp

[57] ABSTRACT

A thin film field effect transistor and method for forming the same are disclosed. Conductive moat bodies 16 and 18 are formed on a surface 12 of an insulator substrate 10. A semiconductor channel layer 20 is formed covering the moat bodies 16 and 18 and the surface 12. A gate insulator layer 22 is formed covering the channel layer 20 between the moat bodies 16 and 18. A gate conductor 26 is formed outwardly from the gate insulator layer 22. Moat bodies 16 and 18 provide efficient contact points for a source contact 56 and a drain contact 60. Additionally, moat bodies 16 and 18 provide additional material from which silicide bodies 48 and 52 may be optionally formed.

34 Claims, 1 Drawing Sheet

FIG. 1f

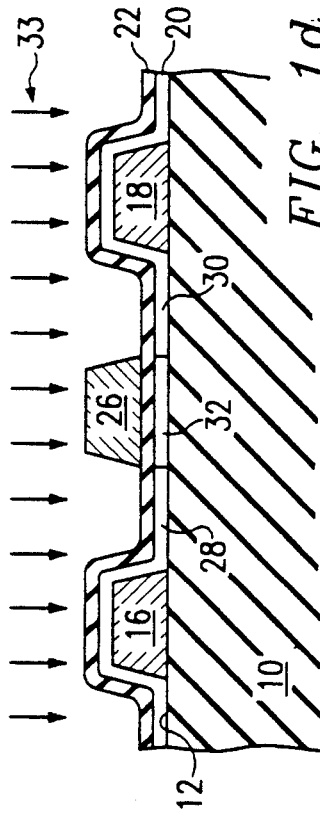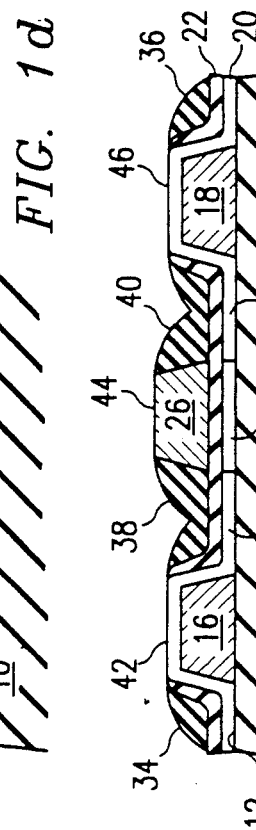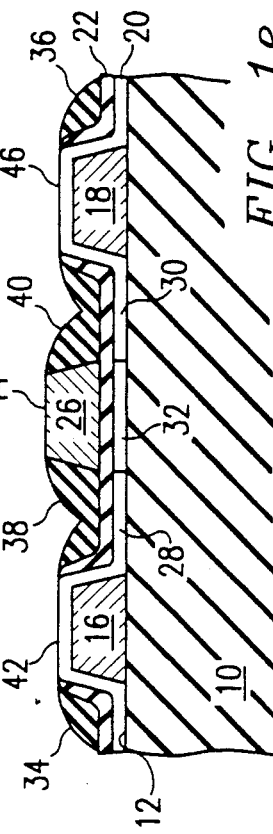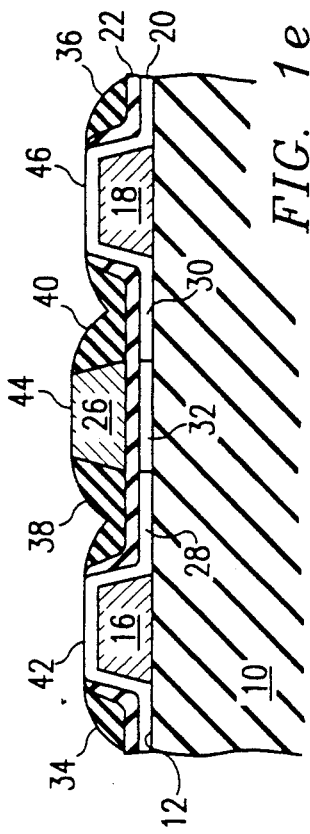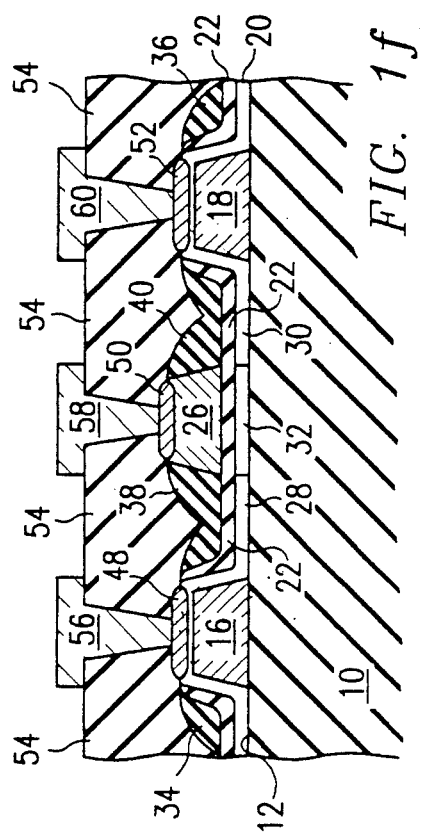

TRANSISTOR

TECHNICAL FIELD OF THE INVENTION

This invention relates in general to the field of electronic devices and more specifically to a transistor and method for forming the same.

BACKGROUND OF THE INVENTION

The field effect transistor forms the building block of many modern digital integrated electronic devices. In order to increase the active device density of electronic devices, thin film transistors have been developed which provide adequate transfer characteristics but do not require the use of bulk single-crystal semiconductor material. A thin film field effect transistor may use polycrystalline, amorphous, partially recrystallized or completely recrystallized semiconductor material comprising its channel.

An important characteristic of a field effect transistor is the depth of the channel region. In order for a transistor to demonstrate optimum transfer characteristics, the depth of the layer of semiconductor material forming the channel of a thin film transistor can be extremely shallow. Depending upon the operational characteristics required of the particular device, the channel region could be anywhere from 200 to 2000 angstroms in depth. Because of this shallow nature of the channel layer, contacting the channel layer at the source and drain regions can be extremely difficult. An etching process is required to open windows to the source and drain regions in order to make these contacts. These etching processes can very easily etch completely through the channel layer because of its shallow nature, dramatically affecting the operational characteristics of the transistor.

A further requirement of conventional field effect transistors is that the resistances associated with the contacts to the source and drain regions of the transistor must be appropriately controlled. A common method for reducing the contact resistance of the source and drain regions is the formation of a silicide layer on the source and drain regions. In the context of a thin film transfer, any attempt to form a silicide layer on the source and drain region of a channel layer of a thin film device can also erode the channel layer as the formation of a silicide layer necessarily consumes the semiconductor material on which it is formed.

Accordingly, a need has arisen for a thin film transistor architecture which provides for efficient contact to the source and drain regions of the channel layer. A further need has arisen for a thin film transistor architecture which allows for the formation of a silicide layer in contact with the source and drain regions in order to reduce the contact resistances associated with the transistor without eroding the thin film of material used to form the channel of the transistor.

SUMMARY OF THE INVENTION

In accordance with the present invention, a thin film transistor is provided which substantially eliminates or reduces disadvantages and problems associated with prior art thin film transistor architectures. More specifically, the present invention discloses a thin film transistor architecture which is formed on a surface of a substrate and which includes spaced apart conductive bodies on the surface on which a channel layer is formed. A gate insulator layer is formed on the channel layer between the conductive bodies and a gate conductor is formed on the gate insulator layer such that it is operable to electrically actuate a portion of the channel layer proximate the gate conductor.

An important technical advantage of the present invention inheres in the fact that the conductive bodies provide points at which the opposite ends of the channel layer may be contacted. A further technical advantage of the present invention is that the conductive bodies provide additional material from which a silicided layer may be formed if the channel layer is consumed during the process of forming the silicide layer.

BRIEF DESCRIPTION OF THE DRAWINGS

A more complete understanding of the present invention may be acquired by referring to the detailed description and claims when considered in connection with the accompanied drawings in which like reference numbers indicate like features, and wherein:

FIGS. 1a through 1f are cross-sectional elevational diagrams which illustrate method of constructing the thin film transistor of the present invention.

DETAILED DESCRIPTION OF THE INVENTION

Referring to FIGS. 1a through 1f, a process is illustrated for forming a thin film transistor according to the teachings of the present invention. It should be understood that the thin film transistor of the present invention enjoys the important technical advantage of most thin film transistors in that it can be used in a variety of device contexts. Thin film transistors do not require the use of single crystalline semiconductor material and therefore can be formed essentially at any level of a complex three-dimensional semiconductor device. The process illustrated by FIGS. 1a through 1f is intended as a generic process containing the necessary process steps for the formation of a transistor of the present invention. It will be understood by those skilled in the art that the process illustrated in FIGS. 1a through 1f may be applied in a variety of contexts requiring minor alterations to the process illustrated while still enjoying the important technical advantages of the transistor architecture of the present invention.

Referring to FIG. 1a, an insulator substrate 10 comprises an outer surface 12 on which a layer of conductive material 14 is formed. The insulator substrate 10 may comprise, for example, a layer of silicon dioxide or other suitable insulative material. Conductive layer 14 may comprise, for example, polycrystalline, amorphous, partially recrystallized or wholly recrystallized semiconductor material which has been doped with a sufficient amount of impurities to be rendered conductive. The incorporation of impurities into layer 14 could occur during the deposition of layer 14 or at a variety of other times during the formation of the transistor of the present invention according to well known methods. For example, conductive layer 14 could be doped in situ during its deposition of could be implanted with impurities following its deposition.

Referring to FIG. 1b, conductive layer 14 is patterned according to well known photolithographic methods and etched to form first moat body 16 and second moat body 18 spaced apart on surface 12.

Referring to FIG. 1c, a thin channel layer 20 comprising polycrystalline or amorphous semiconductor material is deposited covering the exposed portions of surface 12 and the outer surfaces of first moat body 16 and second moat body 18. Channel layer 20 may then optionally be subjected to a variety of process steps in order to partially or wholly recrystallize the semiconductor material comprising layer 20. Channel layer 20 is used to form the channel of the field effect transistor of the present invention and may be anywhere from 200 to 2,000 angstroms in thickness, depending upon the required device characteristics of the particular transistor. A gate insulator layer 22 is conformally deposited or grown covering the outer surface of channel layer 20. Gate insulator layer 22 may comprise, for example, a layer of silicon dioxide on the order of 200 angstroms in thickness. A gate conductor layer 24 is then conformally deposited covering the outer surface of gate insulator layer 22. Gate conductor layer 24 may comprise, for example, any suitable conductor such as polycrystalline or amorphous semiconductor material incorporating impurities such that gate conductor layer 24 is rendered conductive. As was the case with layer 14, gate conductor layer 24 may be doped with suitable impurities during the formation of layer 24 or after its formation according to well known methods to render gate conductor layer 24 conductive.

Referring to FIG. 1d, gate conductor layer 24 is patterned according to well known photolithographic methods and etched to form gate conductor 26 shown in FIG. 1d. Gate conductor 26 is substantially centered between first moat body 16 and second moat body 18. At this point during the formation of the transistor of the present invention, an ion implantation step may be used to render conductive a source region 28 and a drain region 30 of channel layer 20. Source region 28 extends from the edge of gate conductor 26 over the entire outer surface of first moat body 16. Drain region 30 extends from the opposite edge of gate conductor 26 over the outer surface of second moat body 18. Source region 28 and drain region 30 define therebetween a channel region 32 in channel layer 20. Channel region 32 is actuated by the placement of a sufficient voltage on gate conductor 26 according to the well known operation of field effect transistors.

The implantation step symbolically illustrated in FIG. 1d by arrows 33 can be used to perform a variety of functions. First, a predetermined low energy level implant can be used to render source region 28 and drain region 30 conductive according to the required device characteristics of the transistor. Further, a higher energy level implant can be used to render first moat body 16 and second moat body 18 conductive if these regions were not rendered conductive during or after the deposition of conductive layer 14. A third energy level implant could be used to render gate conductor 26 conductive if the material comprising gate conductor 26 was not rendered conductive during or after the deposition of gate conductor layer 24. In addition, following the implantation step illustrated by arrows 33, suitable annealing processes may be used to achieve the required distribution of impurities throughout channel layer 20. These implantation processes and annealing procedures are well known in the art and will vary greatly depending upon the required device characteristics of the particular transistor.

Referring to FIG. 1e, a layer of insulative material [not shown in entirety] which may comprise, for example, silicon dioxide, can be conformally deposited at this point over the entire outer surface covering the outer surface of gate insulator layer 22 and the outer surfaces of gate conductor 26. This insulative layer is anisotropically etched using an etchant selective to the particular semiconductor material comprising the gate conductor 26 and/or the channel layer 20. This anisotropic etch process forms sidewall bodies 34 and 36 and first insulative mask body 38 and second insulative mask body 40. Insulative mask bodies 38 and 40 function to protect source region 28 and drain region 30 during the optional processes used to form silicided source, drain and gate electrodes of the transistor of the present invention which will be discussed more fully herein. If silicidation is not required, insulative mask bodies 38 and 40 are accordingly not required. During the anisotropic etch process, an outer surface 42 of source region 28 disposed outwardly from first moat body 16 is exposed. Additionally, an outer surface 44 of gate conductor 26 is also exposed during the anisotropic etch process. Finally, an outer surface 46 of drain region 30 disposed outwardly from second moat body 18 is exposed during the anisotropic etch process.

The final structure of the transistor of the present invention is shown in FIG. 1f, which illustrates the process steps needed for completion of the transistor. First, while the structure appears in the form illustrated in FIG. 1e, the exposed surfaces 42, 44 and 46 may be subjected to a self-aligned siliciding process to form silicide body 48 in contact with source region 28, silicide body 50 in contact with gate conductor 26 and silicide body 52 in contact with drain region 30. Silicide bodies 48, 50 and 52 may comprise, for example, titanium disilicide formed according to well known self-aligned siliciding methods. It should be understood that while silicide bodies 48 and 52 are shown in FIG. 1f as slightly separated from first moat body 16 and second moat body 18, respectively, the self-aligned siliciding process could consume all of the semiconductor material exposed outwardly from first moat body 16 and second moat body 18. An important technical advantage of the transistor architecture of the present invention is thus readily apparent. The inclusion of first moat body 16 and second moat body 18 provides material from which silicide bodies 48 and 52 can be formed without concern for the extremely thin nature of channel layer 20. If raised moat bodies 16 and 18 were not present, the formation of silicide bodies 48 and 52 could very well erode the entirety of channel layer 20, leaving no material to contact source region 28 and drain region 30.

In the next process step, an isolation insulator layer 54 is deposited over the entire structure. Isolation insulator layer 54 may comprise, for example, a thick layer of silicon dioxide. Openings are then formed through isolation insulator layer 54 using well known photolithographic methods and an etchant step which is selective to the semiconductor material used for gate conductor 26 or conductor bodies 16 and 18 or channel layer 20 if no silicidation process was used or selective to silicide if silicide bodies 48, 50 and 52 were formed previously. These openings expose portions of the outer surfaces of silicide bodies 48, 50 and 52. A layer of conductive material which may comprise, for example, metal or polycrystalline or amorphous semiconductor material doped to be rendered conductive is then deposited and patterned and etched according to well known photolithographic methods to form source contact 56, gate contact 58 and drain contact 60 as shown in FIG. 1f. An additional important technical advantage of the transistor architecture of the present invention is readily apparent in the final processing steps discussed above. If in the particular device context the silicide bodies 48, 50 and 52 were not included in the transistor architecture, the formation of contact 56 and 60 would require an etchant process to expose the outer surfaces of source region 28 and drain region 30. This etchant process could easily erode completely through channel layer 20. If this were to occur in the transistor architecture of the present invention, contact is still made through first moat body 16 and second moat body 18. If first moat body 16 and second moat body 18 were not included, effective contact with source region 28 and drain region 30 would be extremely difficult.

In summary, a field effect transistor architecture has been disclosed, which comprises a very thin channel layer 20. The channel layer 20 is formed covering a first moat body 16 and a second moat body 18. Moat bodies 16 and 18 are conductive bodies which allow for more reliable contact to be made to the source region 28 and drain region 30 of the transistor. The moat bodies 16 and 18 also provide additional material for the formation of silicide layers in contact with the source regions 28 and drain regions 30.

In operation, the field effect transistor illustrated in FIG. 1f is actuated by placing a voltage on gate conductor 26 through gate contact 58 and silicide region 50. This voltage renders channel region 32 conductive and allows current to pass between source region 28 and drain region 30. A conduction path is thus formed from source contact 56 through silicide region 48 through source region 28 and channel region 32 through drain region 30 and silicide body 52 and exiting the device through drain contact 60.

Although the present invention has been described in detail with reference to the particular embodiment illustrated in the architecture of FIG. 1f, it should be understood that various changes, substitutions and alterations may be made hereto without departing from the spirit and scope of the invention as defined by the appended claims.

What is claimed is:

1. A transistor disposed on a surface of a substrate, comprising:
   first and second conductive bodies spaced apart and disposed on the surface;
   a channel layer having a center portion and first and second side portions separated by said center portion, said first and second side portions respectively electrically coupled to said first and second conductive bodies, said center portion of said channel layer covering the surface between said first and second conductive bodies, said first and second side portions respectively covering said first and second conductive bodies such that said first and second conductive bodies are disposed between the surface and said first and second side portions, respectively;
   a gate insulator layer disposed outwardly from said channel layer between said first and second conductive bodies such that said channel layer is disposed between said gate insulator layer and the surface; and
   a gate conductor disposed outwardly from said gate insulator layer such that said gate insulator layer is disposed between said gate conductor and said channel layer, said gate conductor operable to electrically actuate a portion of said channel layer proximate said gate conductor.

2. The transistor of claim 1 wherein said channel layer comprises polycrystalline semiconductor material.

3. The transistor of claim 1 wherein said channel layer comprises amorphous semiconductor material.

4. The transistor of claim 1 wherein said channel layer comprises partially recrystallized semiconductor material.

5. The transistor of claim 1 wherein said channel layer comprises wholly recrystallized semiconductor material.

6. The transistor of claim 1 and further comprising first and second conductive contacts electrically coupled to said channel layer outwardly from respective first and second conductive bodies.

7. The transistor of claim 6 wherein said channel comprises silicon and further comprising first and second silicide bodies respectively coupling said first and second conductive contacts to said channel layer.

8. The transistor of claim 7 wherein said first and second silicide bodies comprise titanium disilicide.

9. The transistor of claim 1 and further comprising a gate contact electrically coupled to and disposed outwardly from said gate conductor.

10. The transistor of claim 9 wherein said gate conductor comprises silicon and further comprising a silicide body disposed between and electrically coupling said gate contact and said gate conductor.

11. The transistor of claim 1 and further comprising:
   an insulative mask covering said channel layer between said gate conductor and said first and second conductive bodies.

12. The transistor of claim 11 wherein said first and second insulative mask bodies comprise an oxide material.

13. The transistor of claim 11 wherein said first and second insulative mask bodies comprise a nitride material.

14. The transistor of claim 1 wherein said first and second conductive bodies comprise polycrystalline semiconductor material.

15. The transistor of claim 1 wherein said first and second conductive bodies comprise amorphous semiconductor material.

16. The transistor of claim 1 wherein the substrate comprises an insulator.

17. The transistor of claim 16 wherein said insulator comprises an oxide material.

18. The transistor of claim 16 wherein said insulator comprises a nitride material.

19. The transistor of claim 1 wherein said gate conductor comprises polycrystalline semiconductor material.

20. The transistor of claim 1 wherein said gate conductor comprises amorphous semiconductor material.

21. The transistor of claim 1 wherein said first and second conductive bodies comprise partially recrystallized semiconductor material.

22. The transistor of claim 1 wherein said gate conductor comprises partially recrystallized semiconductor material.

23. The transistor of claim 1 wherein said first and second conductive bodies comprise wholly recrystallized semiconductor material.

24. The transistor of claim 1 wherein said gate conductor comprises wholly recrystallized semiconductor material.

25. The transistor of claim 1 and further comprising:

a first doped region of said channel layer between said first conductive body and said gate conductor doped so as to be rendered conductive;

a second doped region of said channel layer between said second conductive body and said gate conductor doped so as to be rendered conductive;

a channel region defined between said first and second doped regions in said channel layer inwardly from said gate conductor, said gate conductor operable to electrically actuate said channel region such that a current path is selectively formed through said first doped region, said channel region and said second doped region.

26. A thin film field effect transistor formed on a surface of an insulative layer, comprising:

a first conductive body disposed on the surface;

a second conductive body disposed on the surface and spaced apart from said conductive body;

a channel layer having a center portion and first and second side portions, said center portion covering the surface between said first and second conductive bodies, said first and second side portions of said channel layer respectively electrically coupled to said first and second conductive bodies, said first conductive body disposed between said first side portion and the surface, said second conductive body disposed between said second side protion and the surface;

a gate insulator layer disposed outwardly from said channel layer between said first and second conductive bodies such that said channel layer is disposed between the surface and said gate insulator layer;

a gate conductor disposed outwardly from said gate insulator such that said gate insulator is disposed between said channel layer and said gate conductor;

a first conductive contact electrically coupled to said first side portion of said channel layer outwardly from said first conductive body;

a second conductive contact electrically coupled to said second side portion of said channel layer outwardly from said second conductive body;

a first doped region of said channel layer disposed between said first conductive body and said gate conductor;

a second doped region of said channel layer disposed between said second conductive body and said gate conductor, said first and second doped regions comprising impurities such that said first and second doped regions are electrically conductive;

a channel region defined between said first and second doped regions in said channel layer inwardly from said gate conductor, said gate conductor operable to electrically actuate said channel region such that a current path is selectively formed through said first doped region, said channel region and said second doped region; and an insulative mask covering said first and second doped regions.

27. The transistor of claim 26 wherein said channel layer comprises polycrystalline semiconductor material.

28. The transistor of claim 26 wherein said channel layer comprises amorphous semiconductor material.

29. The transistor of claim 26 wherein said channel layer comprises silicon and further comprising:

first and second silicide bodies respectively coupling said first and second conductive contacts to said first and second side portions of said channel layer.

30. The transistor of claim 29 wherein said first and second silicide bodies comprise titanium disicilide.

31. The transistor of claim 26 wherein said gate conductor comprises silicon and further comprising:

a silicide body disposed between and electrically coupling said gate contact and said gate conductor.

32. The transistor of claim 26 wherein said insulative mask comprises an oxide material.

33. The transistor of claim 27 wherein said first and second conductive bodies and said gate conductor comprise polycrystalline semiconductor material doped so as to be rendered conductive.

34. The transistor of claim 26 wherein said first and second conductive bodies and said gate conductor comprise amorphous semiconductor material doped so as to be rendered conductive.

* * * * *